(12) United States Patent
Bae et al.

(10) Patent No.: US 9,699,898 B2
(45) Date of Patent: Jul. 4, 2017

(54) CONDUCTIVE FILM AND METHOD FOR MANUFACTURING SAME

(71) Applicant: LG CHEM, LTD., Seoul (KR)

(72) Inventors: Sunghak Bae, Daejeon (KR); Jinyong Lee, Daejeon (KR); Sangcholl Han, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/913,939

(22) PCT Filed: Dec. 26, 2014

(86) PCT No.: PCT/KR2014/012872
§ 371 (c)(1),
(2) Date: Feb. 23, 2016

(87) PCT Pub. No.: WO2015/099475
PCT Pub. Date: Jul. 2, 2015

(65) Prior Publication Data
US 2016/0219697 A1    Jul. 28, 2016

(30) Foreign Application Priority Data

Dec. 27, 2013    (KR) .................. 10-2013-0165199

(51) Int. Cl.
| | | |
|---|---|---|
| *H05K 1/00* | (2006.01) | |
| *H05K 1/02* | (2006.01) | |
| *G06F 3/041* | (2006.01) | |
| *H01L 51/44* | (2006.01) | |
| *H05K 3/00* | (2006.01) | |

(Continued)

(52) U.S. Cl.
CPC .......... *H05K 1/0296* (2013.01); *G06F 3/041* (2013.01); *H01L 51/445* (2013.01); *H05K 3/0011* (2013.01); *H05K 3/10* (2013.01); *G06F 3/044* (2013.01); *G06F 2203/04103* (2013.01);
(Continued)

(58) Field of Classification Search
CPC .......... H05K 1/02; H05K 1/0296; H05K 3/10; H05K 3/11; H05K 3/44; H01L 21/02; H01L 21/27; H01L 21/48; H01L 21/70; G06F 3/04; G06F 3/044
USPC ........ 174/253, 250, 255; 438/108, 243, 253, 438/257, 396; 257/67, 304, 524, 678, 257/758
See application file for complete search history.

(56) References Cited

U.S. PATENT DOCUMENTS 3,891,514 A * 6/1975 Klemm ............... C25D 1/08
204/281
4,238,762 A * 12/1980 McWilliams ..... H01L 21/76297
257/506
(Continued)

FOREIGN PATENT DOCUMENTS

| CN | 102016766 A | 4/2011 |
|---|---|---|
| EP | 2544080 A2 | 1/2013 |

(Continued)

*Primary Examiner* — Xiaoliang Chen
(74) *Attorney, Agent, or Firm* — Dentons US LLP

(57) ABSTRACT

The present invention provides a conductive film including a plurality of groove units of which horizontal sections are formed in a lattice form, and a plurality of cells that are regions surrounded by the groove units, wherein at least a part of the groove unit include a conductive pattern formed through separation by a separation unit, and a method for preparing the same.

15 Claims, 10 Drawing Sheets

(51) Int. Cl.
*H05K 3/10* (2006.01)
*G06F 3/044* (2006.01)

(52) U.S. Cl.
CPC ............ *G06F 2203/04111* (2013.01); *G06F 2203/04112* (2013.01); *Y02E 10/549* (2013.01)

(56) References Cited

U.S. PATENT DOCUMENTS

| | | | | |
|---|---|---|---|---|
| 4,419,425 A * | 12/1983 | Ogawa | ................... | G03F 7/0007 257/E31.121 |
| 4,564,997 A * | 1/1986 | Matsuo | ............... | H01L 21/0272 148/DIG. 131 |
| 5,438,013 A * | 8/1995 | Kim | ................... | H01L 27/10817 257/E21.02 |
| 6,197,397 B1 * | 3/2001 | Sher | ........................... | C09J 5/08 156/245 |
| 6,437,441 B1 * | 8/2002 | Yamamoto | ........ | H01L 21/76801 257/262 |
| 6,459,115 B1 * | 10/2002 | Kim | ........................ | H01L 28/60 257/300 |
| 6,657,229 B1 * | 12/2003 | Eguchi | .................. | H01L 21/761 257/67 |
| 2002/0094604 A1 * | 7/2002 | Hayama | .............. | H01L 21/4867 438/108 |
| 2002/0190312 A1 * | 12/2002 | Lee | ....................... | H01L 27/105 257/321 |
| 2003/0111732 A1 * | 6/2003 | Goda | ............... | H01L 21/76838 257/758 |
| 2004/0000684 A1 * | 1/2004 | Park | .................. | H01L 27/10814 257/304 |
| 2005/0003640 A1 | 1/2005 | Ushiyama et al. | | |
| 2005/0124117 A1 * | 6/2005 | Hyun | ................ | H01L 27/11521 438/257 |
| 2005/0170585 A1 * | 8/2005 | Park | .................. | H01L 27/10817 438/253 |
| 2005/0253290 A1 * | 11/2005 | Yokoyama | ......... | B29C 33/3857 264/1.1 |
| 2006/0246657 A1 * | 11/2006 | Kim | .................. | H01L 21/76224 438/243 |
| 2009/0008529 A1 * | 1/2009 | Sugimoto | ........... | B29C 33/3857 249/127 |
| 2009/0101926 A1 * | 4/2009 | Lee | ......................... | H01L 33/08 257/94 |
| 2009/0120660 A1 | 5/2009 | Park et al. | | |
| 2009/0219258 A1 | 9/2009 | Geaghan et al. | | |
| 2010/0165469 A1 * | 7/2010 | Hwang | .................... | H01J 11/10 359/614 |
| 2011/0007011 A1 | 1/2011 | Mozdzyn | | |
| 2011/0059403 A1 * | 3/2011 | Sukekawa | ........... | H01L 21/0337 430/312 |
| 2012/0052635 A1 * | 3/2012 | Kang | ................. | H01L 21/76254 438/151 |
| 2012/0291275 A1 | 11/2012 | Rha et al. | | |
| 2012/0313880 A1 | 12/2012 | Geaghan et al. | | |
| 2012/0327021 A1 * | 12/2012 | Ryu | ....................... | G06F 3/044 345/174 |
| 2014/0131075 A1 * | 5/2014 | Jang | ........................ | G06F 3/041 174/255 |
| 2014/0290980 A1 * | 10/2014 | Tang | ....................... | G06F 3/044 174/250 |
| 2014/0293149 A1 * | 10/2014 | Tang | ....................... | G06F 3/044 349/12 |
| 2015/0138151 A1 | 5/2015 | Moran et al. | | |

FOREIGN PATENT DOCUMENTS

| | | |
|---|---|---|
| JP | 2009124098 A | 6/2009 |
| JP | 2009266559 A | 11/2009 |
| JP | 2011517355 A | 6/2011 |
| JP | 2012156498 A | 8/2012 |
| JP | 2013521563 A | 6/2013 |
| KR | 20040103345 A | 12/2004 |
| KR | 20090099435 A | 9/2009 |
| KR | 10-2010-0095886 A | 9/2010 |
| KR | 1020110100034 A | 9/2011 |
| KR | 20120130120 A | 11/2012 |
| KR | 1020120138485 A | 12/2012 |
| KR | 1323764 B1 | 10/2013 |
| TW | 1254340 | 5/1993 |
| WO | 2012173420 A2 | 12/2012 |

* cited by examiner

A-A'

CONDUCTIVE FILM AND METHOD FOR MANUFACTURING SAME

CROSS-REFERENCE TO RELATED APPLICATION(S)

This application is a National Stage Application of International Application No. PCT/KR2014/012872, filed Dec. 26, 2014, and claims the benefit of Korean Patent Application No. 10-2013-0165199 on Dec. 27, 2013, the contents of which are incorporated by reference in their entirety for all purposes as if fully set forth below.

TECHNICAL FIELD

This application claims priority to and the benefits of Korean Patent Application No. 10-2013-0165199, filed with the Korean Intellectual Property Office on Dec. 27, 2013, the entire contents of which are incorporated herein by reference.

The present disclosure relates to a conductive film and a method for preparing the same.

BACKGROUND ART

A conductive substrate forming a conductive micropattern on a polymer film or a glass substrate is used in various fields such as organic solar cells, hot wire glass, touch panels, transparent displays or flexible displays.

Meanwhile, such a conductive substrate forming a conductive micropattern may be prepared in various manners, and for example, a method forming a groove unit on a transparent substrate, forming a conductive layer on the groove unit-formed transparent substrate, and then removing the conductive layer formed on parts other than the groove unit is generally used.

A horizontal sectional diagram of an existing conductive micropattern-formed conductive substrate prepared using such a method is shown in FIG. 1, and a vertical sectional diagram of an A-A' section of the existing conductive substrate is shown in FIG. 2. As shown in FIG. 1 and FIG. 2, an existing conductive micropattern is formed by regularly arranging a conductive pattern (300) having a constant space widthwise and lengthwise on a substrate (20). Herein, the conductive pattern (300) forming a lattice may be obtained by forming a conductive layer on the groove unit-formed transparent substrate, and then removing the conductive layer formed on parts other than the groove unit.

However, the process of removing a conductive layer formed on parts other than a groove unit for forming a pattern has no serious problem when a linewidth of the pattern is relatively broad, however, when a micropattern having a linewidth of 5 μm or less is formed, a conductive layer formed on the wall surface of the groove unit comes out together and is removed while removing a conductive layer formed on parts other than the groove unit, and as being affected therefrom, a part of the conductive layer formed on the floor surface of the groove unit is removed together sometimes, and as a result, short circuit occurs in the formed conductive micropattern leading to a problem of poor product qualities.

The linewidth of a pattern needs to be relatively broad in order to prevent such problems, however, in this case, there is a problem in that the formed pattern is visually recognized, and is not suited for use as a transparent substrate. Accordingly, the development of a conductive film having an excellent film-forming property and suited for use as a transparent substrate since the pattern is not visually recognized has been urgently required.

DISCLOSURE

Technical Problem

In view of the above, an object of the present invention provides a conductive film having an excellent film-forming property and suited for use as a transparent substrate since the pattern is not visually recognized, and a method for preparing the same.

Technical Solution

In one aspect, the present invention provides a conductive film including a plurality of groove units of which horizontal sections are formed in a lattice form, and a plurality of cells that are regions surrounded by the groove units, wherein at least a part of the groove units include a conductive pattern formed through separation by a separation unit.

Herein, a maximum depth of the groove unit may be from 0.2 μm to 10 μm, and a maximum width of the groove unit may be from 0.1 μm to 20 μm.

In addition, the lattice form may include a groove unit formed by widthwise extension, a groove unit formed by lengthwise extension, and an intersection at which these intersect.

Meanwhile, in the conductive film according to the present invention, a total sum of the horizontal sectional area of the separation unit measured based on the floor surface of the groove unit may be from 5% to 90% of a total sum of the horizontal sectional area of the groove unit.

In addition, a border of the horizontal section of the separation unit may include a straight line, a curve, a wave line, a zigzag line or a combination thereof.

Herein, the border of the horizontal section shape of the separation unit may be a quadrangle, a triangle, a circle, an ellipse, a polygon, a figure formed by connecting two or more arcs with different radii of curvature, a figure formed by connecting at least one arc and at least one straight line, or a form mixing these.

Meanwhile, a vertical section shape of the separation unit may be a plane shape, a convex shape or a concave shape.

In addition, a horizontal section shape of the cell may be a quadrangle, a triangle, a circle, an ellipse, a polygon or a form mixing these.

Next, the separation unit and the cell may satisfy the relationship of the following [Equation 1].

$$\frac{1}{10^6} \leq \frac{\text{Horizontal Sectional Area of One Separation Unit}}{\text{Horizontal Sectional Area of One Cell}} \leq \frac{1}{5} \quad [\text{Equation 1}]$$

(Herein, the horizontal sectional area means a value measured based on an uppermost surface of the conductive film.)

Meanwhile, in the present invention, a width of the conductive pattern formed through separation by the separation unit may be from 0.1 μm to 5 μm, and a width of a conductive pattern part formed by connecting a conductive pattern that is not formed through separation by the separation unit may be from 0.2 μm to 10 μm.

In addition, the conductive pattern formed at the intersection has a cross shape connecting 4 corners of the intersection, and a width of the cross-shaped conductive pattern may be from 0.1 µm to 10 µm.

Herein, a thickness of the conductive pattern may be from 0.01 µm to 3 µm.

In addition, the conductive pattern may be formed using one or more types selected from the group consisting of gold, silver, copper, aluminum, nickel, chromium, platinum, carbon, molybdenum, magnesium, alloys thereof, oxides thereof, or silicon oxides. Herein, the conductive pattern may be formed in two or more layers.

In another aspect, the present invention provides a method for preparing a conductive film including forming a plurality of groove units including a separation unit on a transparent substrate; forming a conductive layer on the transparent substrate on which a plurality of the groove units are formed; and removing the separation unit included in a plurality of the groove units, and the conductive layer formed on parts other than the groove units.

Herein, the forming the plurality of groove units may be carried out using an imprinting method.

In addition, the forming the conductive layer may be carried out using an electroless plating method, a chemical vapor deposition method, a physical vapor deposition method or a wet coating method.

Next, the step of removing the conductive layer may be carried out using a scratching method, a detaching method or a combination thereof.

Advantageous Effects

A conductive film according to the present invention includes a separation unit in a groove unit, and therefore, when comparing to cases that do not include a separation unit, relatively more connecting parts are present in the same area. Among parts connecting a conductive layer formed on a cell or a separation unit and a conductive layer of a groove unit floor surface, these connecting parts particularly means a part in which the connection is readily broken, for example, an edge part, and as the number of the connecting parts increases, the conductive layer formed on the groove unit floor surface is hardly affected while removing the conductive layer formed on the cell or separation unit in a process of removing the conductive layer in order to form a conductive pattern. As a result, selective film formation selectively removing only the conductive layer present on the separation unit and the cell is readily achieved, and accordingly, an excellent effect of significantly improving conductive film productivity is obtained.

In addition, a conductive film according to the present invention may form a pattern having a fine linewidth compared to existing conductive films, therefore, the pattern is not visually recognized and films having excellent transparency may be obtained.

REFERENCE NUMERAL

Figure 1:
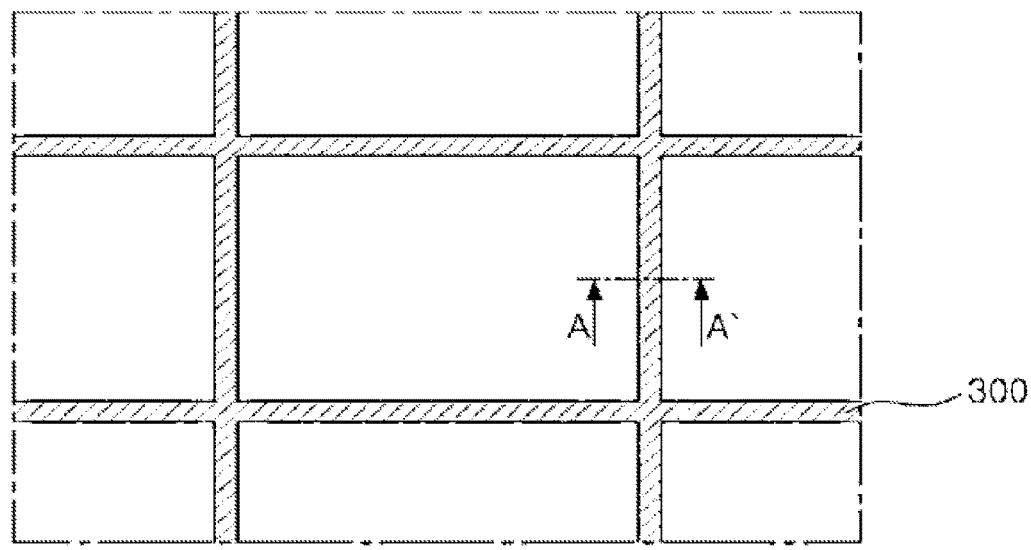
FIG. 1 shows a horizontal section of a conductive substrate on which an existing conductive micropattern is formed.
Figure 2:
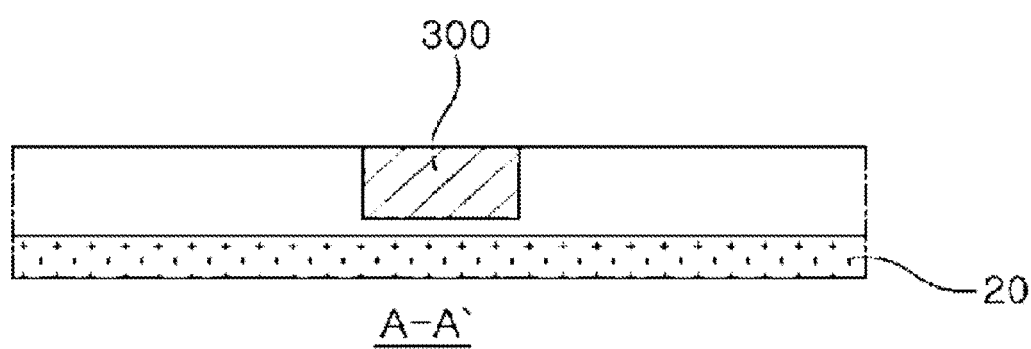
FIG. 2 shows a vertical section enlarging the A-A' part of FIG. 1.

10: Conductive Film
20: Transparent Substrate
100: Groove Unit
110: Width of Groove Unit
120: Depth of Groove Unit
130: Wall Surface of Groove Unit
140: Floor Surface of Groove Unit
200: Cell
300: Conductive Pattern
310: Width of Conductive Pattern Formed through Separation
320: Width of Conductive Pattern Formed through Connection
330: Width of Cross-Shaped Conductive Pattern
340: Thickness of Conductive Pattern
400: Conductive Pattern Formed on Second Layer
500: Separation Unit
510: Height of Highest Point of Separation Unit from Floor Surface of Groove Unit
520: Depth of Lowest Point of Separation Unit from Floor Surface of Groove Unit

MODE FOR DISCLOSURE

Hereinafter, preferred embodiments of the present invention will be described with reference to the accompanying drawings. However, the embodiments of the present invention may be modified to various other forms and the scope of present invention is not limited to the embodiments described below. In addition, the embodiments of the present invention are provided so as to describe the present invention more completely to those skilled in the art. In the drawings, the shapes, and the sizes and the like of elements may be exaggerated for more clear descriptions.

Figure 3:
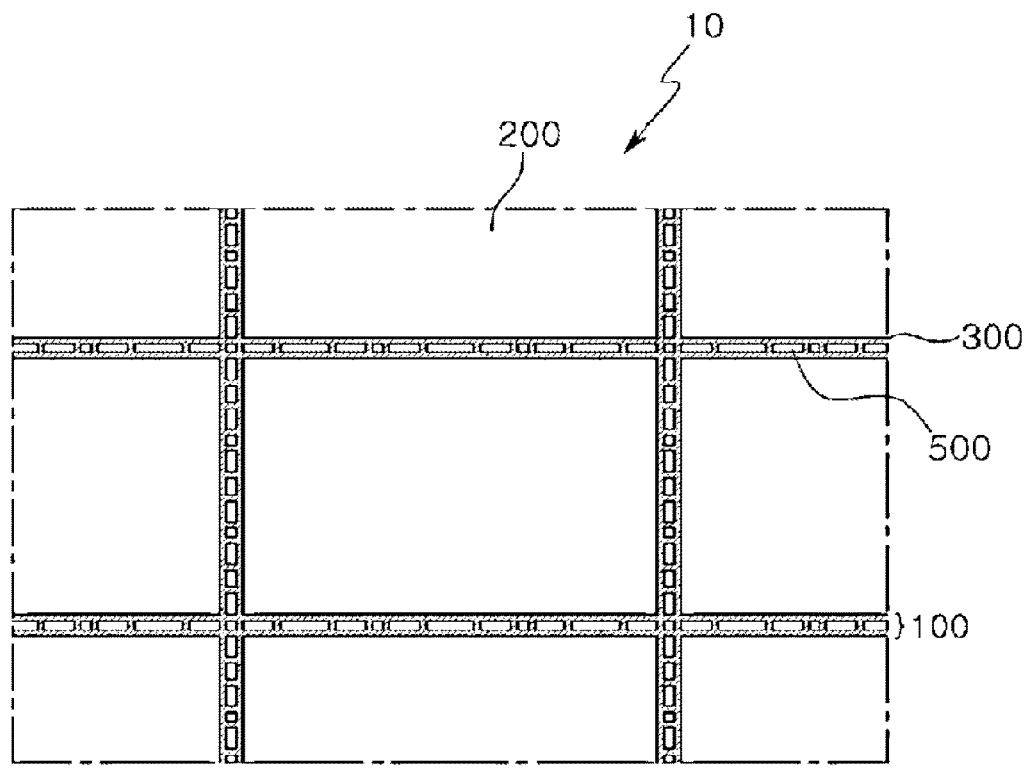
FIG. 3 shows one example of a conductive film on which a conductive pattern is formed according to the present invention.

For better understanding, FIG. 3 illustrates a shape of a section cutting a groove unit (100) of a conductive film (10) according to the present invention in a horizontal direction with respect to the plane of the film (hereinafter, referred to as horizontal section). As shown in FIG. 3, the conductive film (10) according to the present invention includes a plurality of groove units (100) of which horizontal sections are formed in a lattice form and a plurality of cells (200) that are regions surrounded by the groove units (100), wherein the groove units (100) include a conductive pattern (300) of which at least a part is formed through separation by a separation unit (500).

Figure 20:
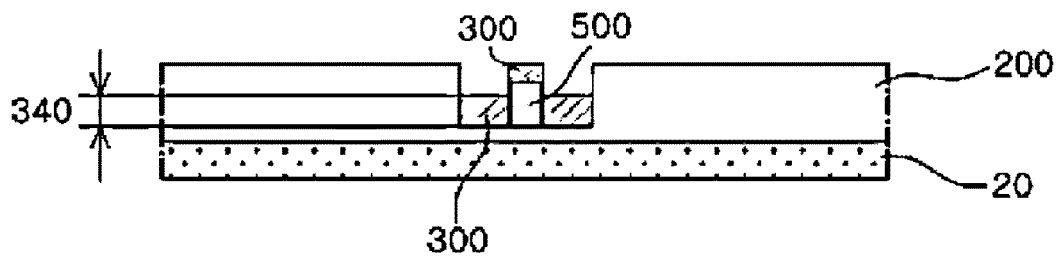
FIG. 20 illustrates a vertical section shape in the case that includes a conductive pattern formed on a separation unit through separation.

Herein, a conductive pattern formed on the separation unit through separation may be included, and while not being limited thereto, this is shown in FIG. 20. For example, on the separation unit, a conductive pattern may be formed as in FIG. 20, or the conductive pattern may be removed using a method described below.

In a plurality of the groove units (100) included in the conductive film (10) according to the present invention, the horizontal section is formed in a lattice form. Herein, the lattice form includes a groove unit formed by widthwise extension, a groove unit formed by lengthwise extension and an intersection at which these intersect. The lattice form in the present specification is for describing the horizontal section shape of the groove unit (100), and its specific form is not particularly limited.

Figure 4:
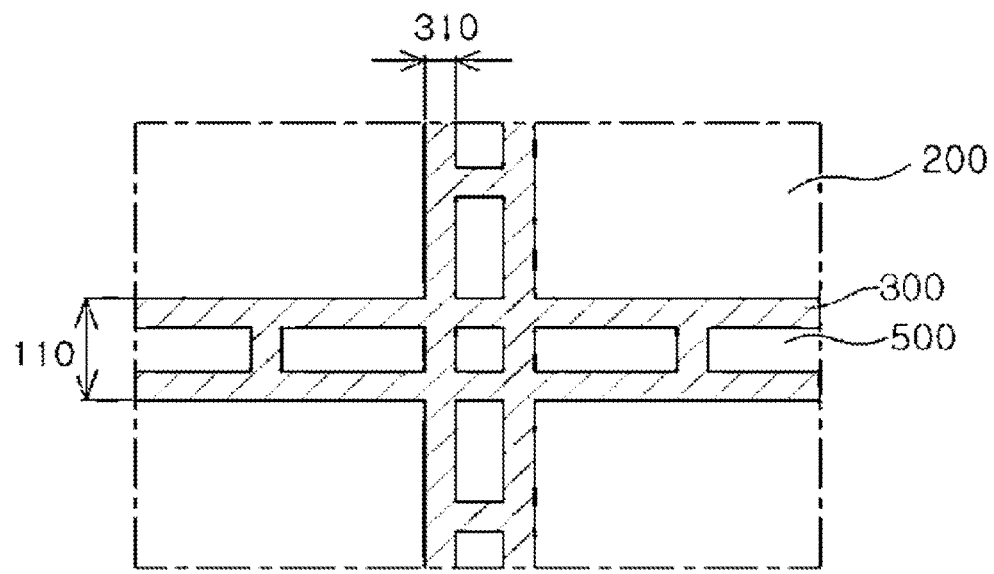
FIG. 4 to FIG. 7 illustrate horizontal section shapes of conductive films according to the present invention in order to describe a groove unit and a separation unit having various horizontal section shapes.
Figure 5:
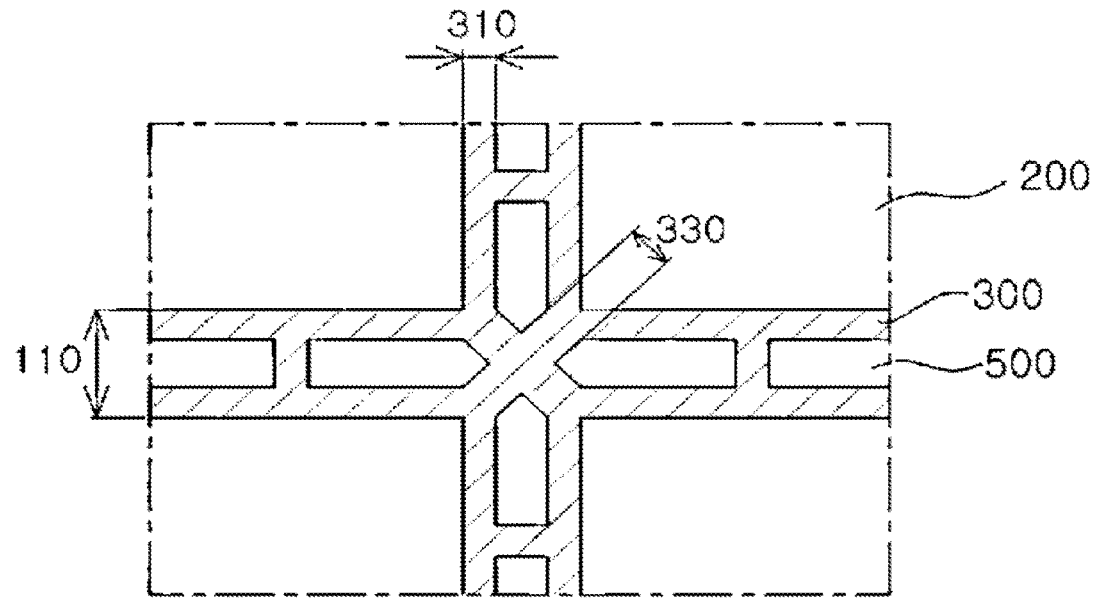
Figure 6:
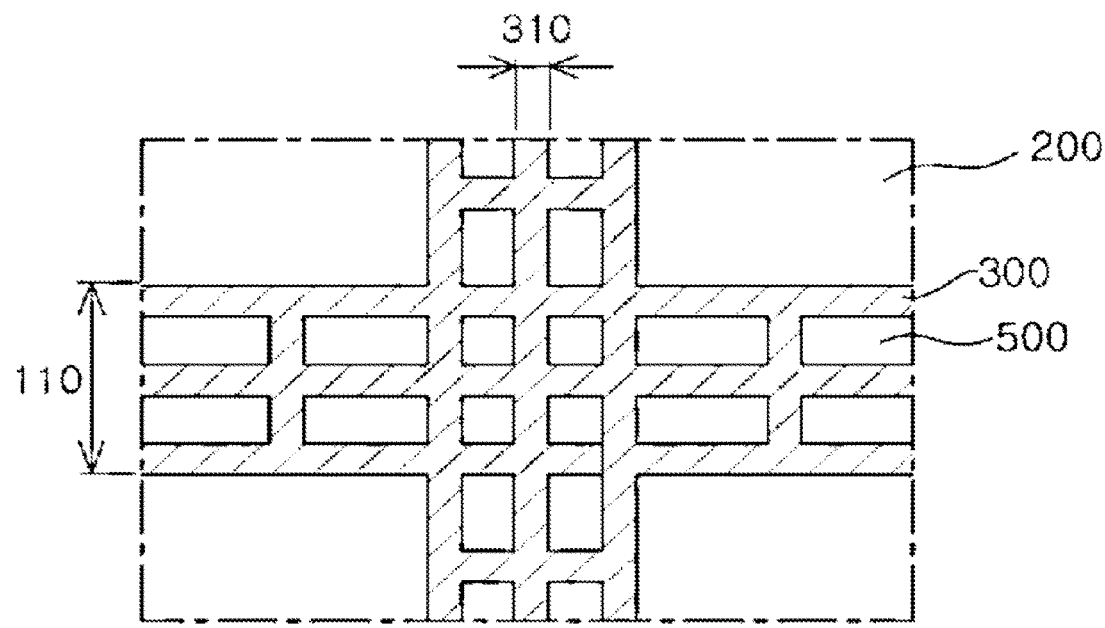
Figure 7:
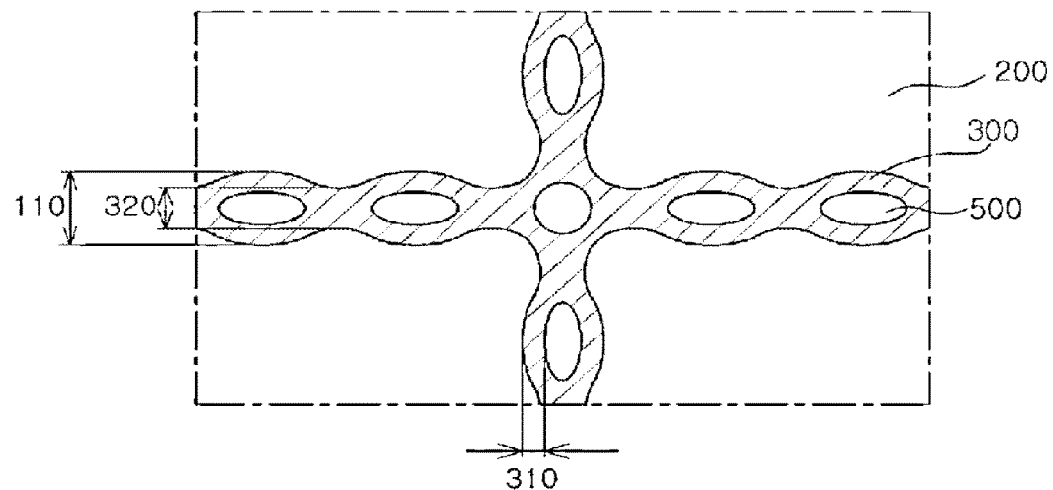

More specifically, FIG. 4 to FIG. 6 illustrate various horizontal section shapes of the groove unit (100) of the present invention. As shown in FIG. 4 to FIG. 6, the horizontal section shape of the groove unit (100) may be formed such that the groove unit formed by widthwise extension and the groove unit formed by lengthwise extension, which form a lattice, are all formed as a straight line, and the 4 corners of the intersection are all right angles. In addition, as shown in FIG. 7, the groove unit formed by widthwise extension and the groove unit formed by lengthwise extension, which form a lattice, may be formed as a curve having peaks and valleys of different sizes, and the 4 corners of the intersection may be formed to a round shape having a constant radius of curvature. In the present specification, various shapes of the groove unit (100) shown in FIG. 4 to FIG. 7 are for illustrative purposes, and in the lattice form of the groove unit (100), the groove unit formed by widthwise extension and the groove unit formed by lengthwise extension may be a straight line, a diagonal line, a broken line, a curve, or have a form mixing these, and the lines forming the 4 corners of the intersection may also be a straight line, a diagonal line, a broken line, a curve, or have a form mixing these.

Figure 8:
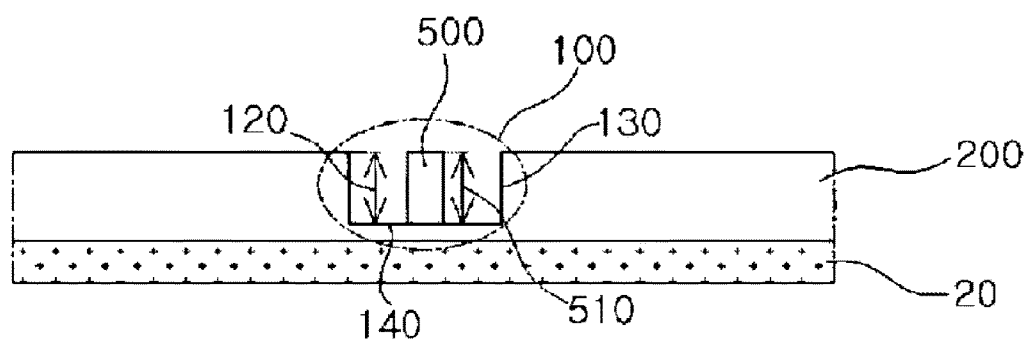
FIG. 8 and FIG. 9 illustrate vertical section shapes of conductive films according to the present invention not forming a conductive pattern in order to describe a separation unit having various vertical section shapes.
Figure 9:
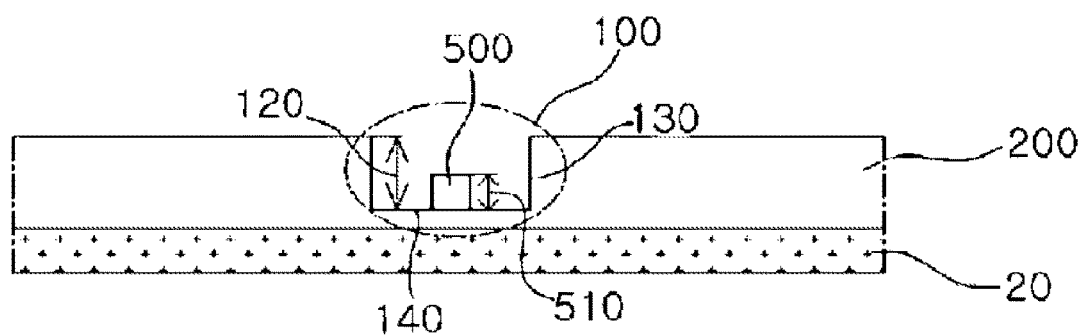
Figure 10A:
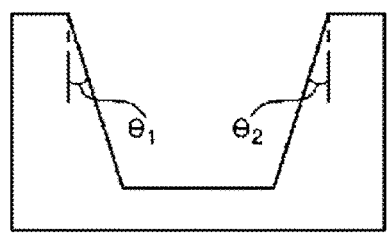
FIGS. 10 (a) and (b) are diagrams for showing an inclined angle of a wall surface among the groove unit constituents of the present invention.
Figure 10B:
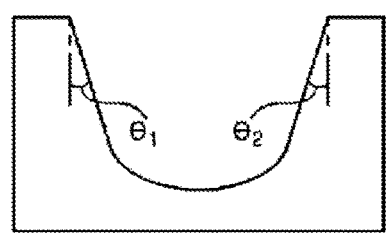
Figure 11:
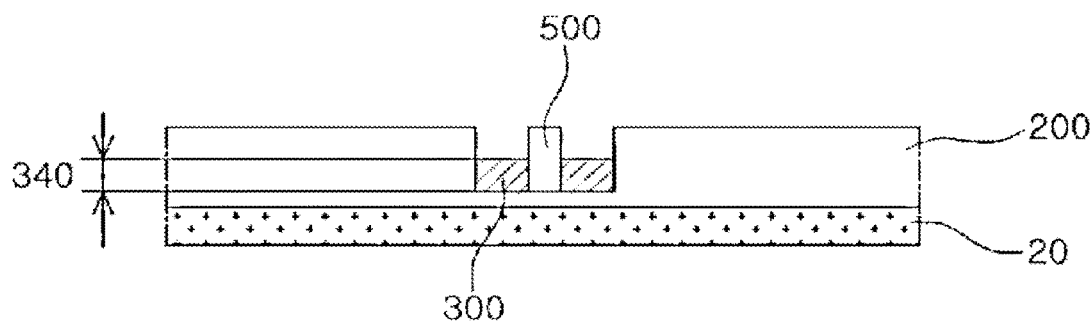
FIG. 11 to FIG. 13 illustrate a vertical section shape of a conductive film according to the present invention forming one conductive layer.
Figure 12:
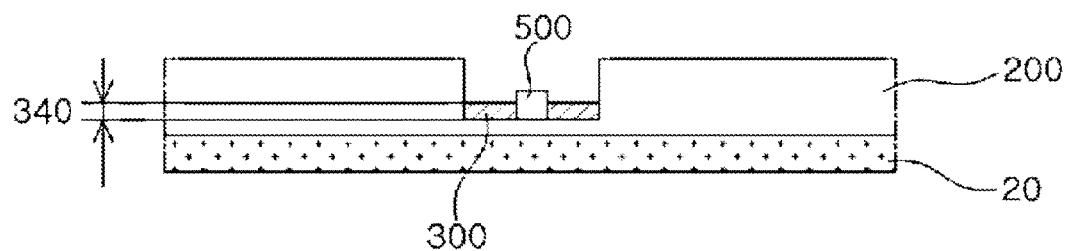

For description, a shape of a section cutting the groove unit of the conductive film (10) according to the present invention not forming a conductive pattern in a vertical direction with respect to the film (hereinafter, referred to as vertical section) is illustrated in FIG. 8 and FIG. 9. The groove unit (100) in the present invention is a space for forming a conductive pattern (300), and as shown in FIG. 8 and FIG. 9, may be formed in an engraved shape having two wall surfaces (130) and a floor surface (140). Herein, the vertical section shape of the groove unit (100) is not limited in its form, and examples thereof may include a quadrangle, a reversed trapezoid, a semi-circle, a semi-ellipse or a form mixing these. As described above, the vertical section shape of the groove unit (100) in the present invention is not particularly limited, however, the width of the uppermost surface of the groove unit (100) needs to be the same as or greater than the width of the floor surface of the groove unit (100). FIG. 10 (a) and FIG. 10 (b) illustrate the vertical section shape of the groove unit that does not include the separation unit in order to describe the inclined angle of the wall surface of the groove unit (100) according to the present invention. As shown in FIG. 10, the inclined angle (θ) of the wall surface of the groove unit (100) is preferably from 0° to 15° (refer to FIG. 10).

Figure 19:
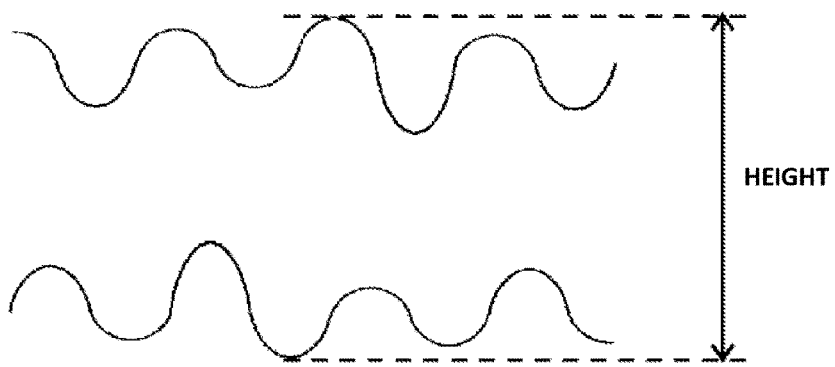
FIG. 19 is a diagram showing a height between the lowest point of the floor surface and the highest point of the uppermost surface in a groove unit.

Meanwhile, the depth (120) of the groove unit may be, for example, 0.2 μm to 10 μm, 0.2 μm to 2 μm or 0.5 μm to 1.5 μm. When the depth (120) of the groove unit is 0.2 μm or greater, the groove unit floor surface, and the cell (200) and the separation unit (500) have a height difference greater than a certain level, therefore, when a conductive layer (300) is formed on a groove unit (100)-formed transparent substrate, and then the conductive layer (300) formed on the cell (200) and the separation unit (500) is removed in order to form a conductive pattern (300), the conductive layer formed on parts other than the separation unit in the groove unit coming out together and being removed may be prevented. In addition, when the depth (120) of the groove unit is 10 μm or less, mold preparation for forming the groove unit (100) including the separation unit (500) is readily achieved, and the maximum width (110) of the groove unit is very readily formed to 5 μm or less. As shown in FIG. 8 and FIG. 9, the depth (120) of the groove unit in the present specification means a height from the floor surface to the uppermost surface of the groove unit (100). In the case that the floor surface or the uppermost surface of the groove unit is not even, the height from the floor surface to the uppermost surface of the groove unit in the present specification may mean a height from the lowest point of the floor surface to the highest point of the uppermost surface of the groove unit, as shown in FIG. 19.

In addition, the maximum width (110) of the groove unit means the longest width among the widths of the groove unit measured in a horizontal direction or a vertical direction, as shown in FIG. 4 to FIG. 7. In other words, as shown in FIG. 7, when the groove unit formed by widthwise extension and the groove unit formed by lengthwise extension are formed as a curve having peaks and valleys of different sizes, and the 4 corners of the intersection are a round shape having a constant radius of curvature in the lattice form forming the groove unit (100), the maximum width (110) of the groove unit means a maximum value among the widths in a horizontal direction or a vertical direction from the wall surface to the wall surface in the groove unit (100) including the separation unit (500).

Herein, the maximum width (110) of the groove unit may be, for example, 0.1 μm to 20 μm, 0.1 μm to 10 μm, 0.1 μm to 5 μm or 0.1 μm to 2 μm. When the maximum width of the groove unit is 0.1 μm or greater, there is an advantage in that productivity may be improved since a mold and the like for forming the groove unit are readily prepared. However, as the width of the groove unit increases, a conductive pattern formed using this groove unit is more visually recognizable, therefore, the use as a transparent conductive film may be difficult.

Meanwhile, in the present invention, the groove units (100) include a conductive pattern (300) of which at least a part is formed through separation by the separation unit (500).

Herein, the separation unit (500) refers to, as shown in FIG. 3 to FIG. 7, a part formed in the groove unit (100)

surrounded by the conductive pattern (300). Herein, the separation unit (500) is formed in the groove unit (100) on the part that the conductive pattern is separated, and has a convex shape. However, when the separation unit (500) is also removed in the conductive layer removal process for forming a conductive pattern, the section of the separation unit (500) may have a concave shape as a result, and the section may have a plane shape when the conductive pattern of the separation unit is separated.

Figure 21:
FIG. 21 illustrates a separation unit having a convex shape, or having a plane shape while having a convex shape.
Figure 22:
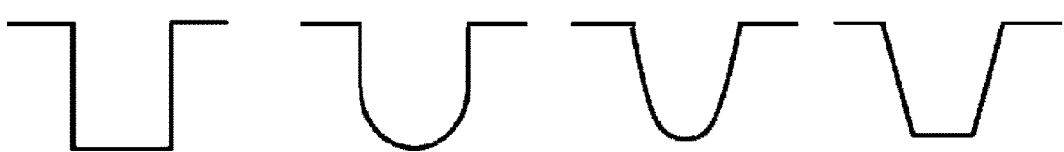
FIG. 22 illustrates a separation unit having a concave shape, or having a plane shape while having a concave shape.

The case of the separation unit having a convex shape, or having a plane shape while having a convex shape is shown in FIG. 21, and the case of the separation unit having a concave shape, or having a plane shape while having a concave shape is shown in FIG. 22, however, the shape is not limited thereto.

For example, when the vertical section shape of the separation unit has a convex shape, the shape may be a rectangle, a bump shape, a conic section shape or a trapezoid, and when the vertical section shape of the separation unit has a concave shape, the shape may have a form vertically symmetrical to the convex shape.

More specifically, as shown in FIG. 8, the separation unit (500) is formed on the floor surface of the groove unit (100) leaving a certain space from the wall surface of the groove unit (100). Herein, the number of the separation units (500) formed in the groove unit (100) is not particularly limited as long as the number is one or more based on the vertical section of the groove unit (100). However, as the number increases, the horizontal section of the conductive pattern has a more complex net shape, and more connecting parts are present. In this case, the conductive layer formed on the wall surface (130) of the groove unit and the floor surface (140) of the groove unit is hardly affected when the separation unit and the conductive layer on the cell are removed using a scratching method, a detaching method and the like, therefore, a selective film-forming property may be more improved.

In addition, the vertical section shape of the separation unit (500) is not particularly limited, but for example, may be a convex shape as shown in FIG. 8 and FIG. 9, and the vertical section border of the separation unit may be a straight line, a curve, a wave line, a zigzag line or a combination thereof. Herein, when the vertical section shape of the separation unit (500) is a convex shape, the height (510) from the floor surface of the groove unit (100) to the highest point of the separation unit may be 0.5 times to 1 times, 0.7 times to 1 times or 0.9 times to 1 times of the depth (120) of the groove unit. When the vertical section of the separation unit (500) has a convex shape, the formation of a groove unit including a number of separation units is readily obtained as the height (510) from the floor surface of the groove unit (100) to the highest point of the separation unit is equal to the depth of the groove unit, and as a result, it is advantageous since the unit cost of production is capable of being reduced.

Figure 13:
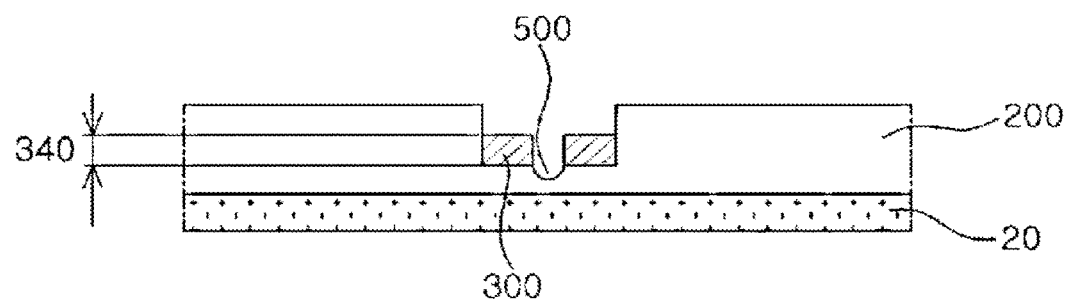

In some cases, the separation unit may be removed as well when the conductive layer on the cell is removed, and herein, the horizontal section shape of the separation unit may be a concave shape as shown in FIG. 13.

Meanwhile, the horizontal section border of the separation unit (500) may be straight line, a curve, a wave line, a zigzag line or a combination thereof.

The shape is not particularly limited, however, examples of the shape may include a quadrangle, a triangle, a circle, an ellipse, a polygon, a figure formed by connecting two or more arcs with different radii of curvature, a figure formed by connecting at least one arc and at least one straight line, or a form mixing these.

For example, when two or more arcs having similar radii of curvature are connected, the horizontal section shape may have a form close to a full circle, and when one arc is connected to one straight line, the shape may have a form close to a semi-circle. In addition, when one arc and two straight lines are connected, the shape may have a form of a water drop or a fan.

Particularly, the horizontal section shape of the separation unit (500) is preferably a quadrangle in terms that a groove unit including a number of separation units may be more readily prepared.

In addition, in the conductive film according to the present invention, a total sum of the horizontal sectional area of the separation unit (500) measured based on the floor surface of the groove unit may be 5% to 90%, 20% to 80%, or 25% to 60% of a total sum of the horizontal sectional area of the groove unit (100). When the horizontal section area of the separation unit (500) satisfies the above numerical range with respect to the area of the groove unit (100), the conductive film according to the present invention may secure both conductivity and a film-forming property.

Meanwhile, as shown in FIG. 3, a plurality of the cells (200) mean a number of regions surrounded by the groove units (100), and are formed in a convex shape.

Herein, the horizontal section shape of the cells (200) may be different depending on the shape of the each line forming the groove unit formed by widthwise extension, the groove unit formed by lengthwise extension and the intersection in the lattice form, and is not particularly limited. More specifically, examples of the horizontal section shape of the cells may be a quadrangle, a triangle, a circle, an ellipse, a polygon or a form mixing these.

Meanwhile, in the conductive film (10) according to the present invention, the separation unit (500) and the cell (200) may satisfy the relationship of, for example, the following [Equation 1]. When the separation unit (500) and the cell (200) satisfy the following Equation 1, that is, when the horizontal sectional area of one separation unit is $1/10^6$ or greater with respect to the horizontal sectional area of one cell, there is an advantage in that a mold for forming a groove unit (100) including a number of separation units (500) is readily prepared, and when the horizontal sectional area of one separation unit is $1/5$ or less with respect to the horizontal sectional area of one cell, there is an advantage in that sufficient conductivity is secured.

$$\frac{1}{10^6} \leq \frac{\text{Horizontal Sectional Area of One Separation Unit}}{\text{Horizontal Sectional Area of One Cell}} \leq \frac{1}{5} \quad \text{[Equation 1]}$$

(Herein, the horizontal sectional area means a value measured based on an uppermost surface of the conductive film.)

Meanwhile, in the conductive film according to the present invention, at least a part of the conductive pattern (300) in the groove unit (100) may be formed through separation by the separation unit (500), as shown in FIG. 3 to FIG. 6. In this case, the width of each of the conductive pattern may be, for example, 0.1 μm to 5 μm, 0.1 μm to 2 μm, or 0.2 μm to 1 μm. When the width of the conductive pattern is 0.1 μm or greater, a mold and the like for preparing a groove unit including a number of separation units are readily prepared, and when the width of the conductive pattern is 5 µm or less, the formed conductive pattern is not visually recognized, therefore, a conductive film having an excellent visual property may be obtained. Herein, as shown in FIG. 4 to FIG. 6, each width (310) of the conductive pattern may be a distance between a separation unit (500) and the wall surface of an adjacent groove unit (100) or a distance between a separation unit (500) and a separation unit (500).

In addition, as shown in FIG. 7, at least a part of the conductive pattern (300) in the conductive film according to the present invention may be formed in the groove unit (100) by being connected. In this case, the width of the conductive pattern formed by being connected may be, for example, 0.2 µm to 10 µm, 0.2 µm to 4 µm, or 0.4 µm to 2 µm. When the width of the conductive pattern is 0.2 µm or greater, a mold and the like for preparing a groove unit including a number of separation units are readily prepared, and when the width of the conductive pattern is 10 µm or less, the formed conductive pattern is not visually recognized, therefore, a conductive film having an excellent visual property may be obtained.

Figure 23:
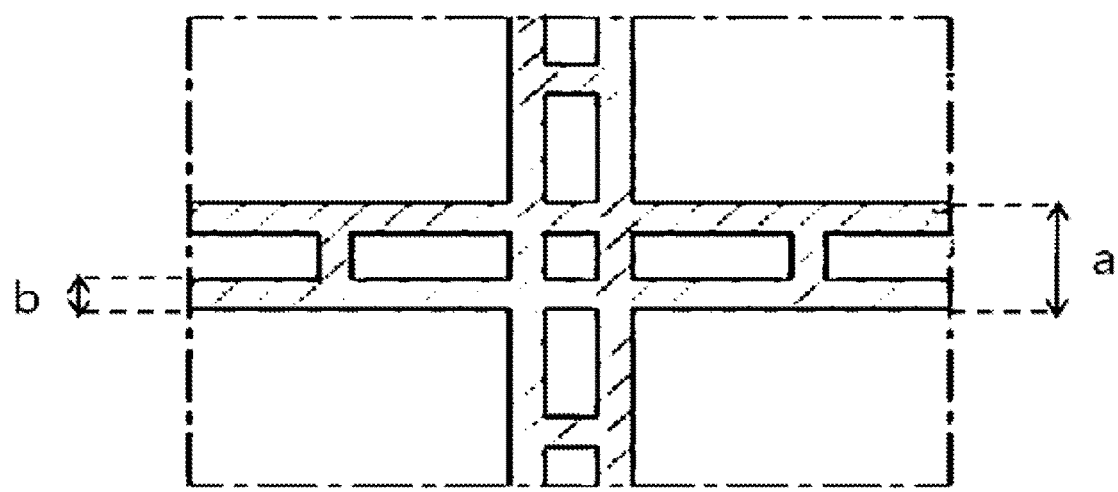
FIG. 23 shows one example of a conductive film formed by connecting a conductive pattern that is not formed through separation by a separation unit.

FIG. 23 shows one example formed by connecting a conductive pattern that is not formed through separation by the separation unit. In FIG. 23, 'a' means the width of the conductive pattern that is not formed through separation, and 'b' means the width of the conductive pattern formed through separation by a separation unit.

Furthermore, as shown in FIG. 5, the conductive pattern (300) in the conductive film according to the present invention may be formed in a cross shape connecting 4 corners of the intersection forming a lattice form of the groove unit (100). In this case, the width (330) of the conductive pattern formed in a cross shape may be, for example, 0.1 µm to 10 µm, 0.1 µm to 4 µm, or 0.2 µm to 2 µm. When the width of the conductive pattern formed in a cross shape is 0.1 µm or greater, a mold and the like for preparing a groove unit including an intersection having such a shape are readily prepared, and when the width of the conductive pattern is 10 µm or less, the formed conductive pattern is not visually recognized, therefore, a conductive film having an excellent visual property may be obtained.

Meanwhile, in the present invention, the thickness (340) of the conductive pattern (300) means a height of the conductive pattern measured based on the vertical section, as shown in FIG. 11 to FIG. 16. Herein, the thickness of the conductive pattern may be, for example, 0.01 µm to 3 µm, 0.05 µm to 1 µm, or 0.1 µm to 0.3 µm. When the thickness of the conductive pattern (300) is 0.01 µm or greater, sufficient conductivity may be secured, and when the thickness of the conductive pattern (300) is 3 µm or less, it is very advantageous since an excellent film-forming property is obtained.

In addition, the conductive pattern (300) may be formed using one or more selected from the group consisting of, for example, gold, silver, copper, aluminum, nickel, chromium, platinum, carbon, molybdenum, magnesium, alloys and oxides thereof, and silicon oxides, however, the material is not limited thereto. Particularly, the conductive pattern (300) is preferably formed with copper, aluminum and the like among these considering economic feasibility and conductivity.

Figure 14:
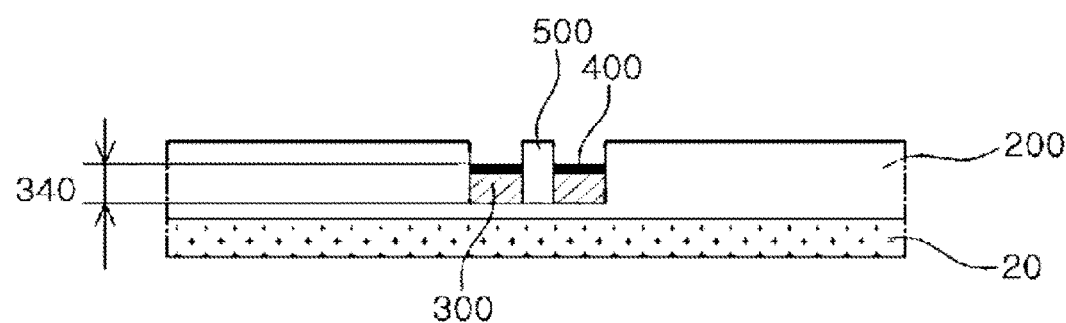
FIG. 14 to FIG. 16 illustrate a vertical section shape of a conductive film according to the present invention forming two conductive layers.
Figure 15:
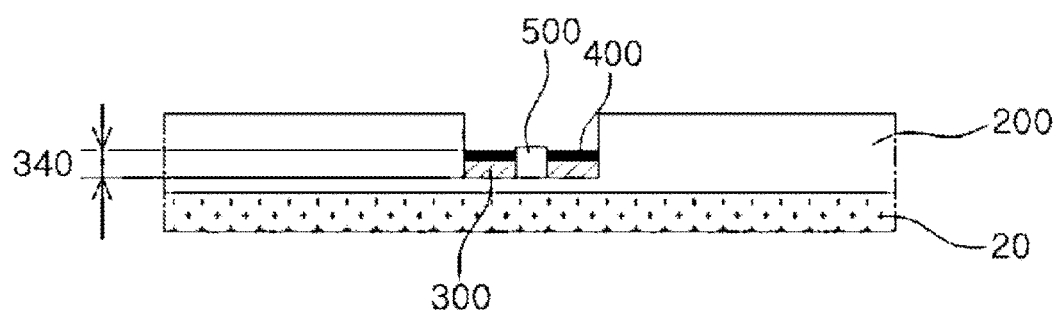
Figure 16:
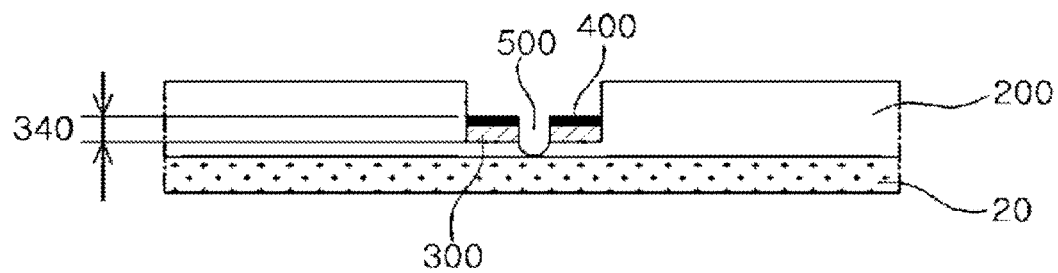

Selectively, the conductive pattern (300, 400) may be formed in two or more layers. Herein, when the conductive pattern (300, 400) is formed in two or more layers, each layer may be formed with different materials, and examples of the materials are the same as the listed materials for forming the conductive pattern (300). FIG. 14 to FIG. 16 show examples forming the conductive pattern in two layers.

The conductive pattern (300) being formed in two or more layers in the present invention is very advantageous in that one layer may be used as an adhesive strength adjusting layer or an absorption layer. For example, by forming a chromium layer or an alumina layer between a copper layer and a groove unit floor surface or wall surface, one layer may be used as an adhesive strength adjusting layer, and consequently, adhesive strength between the groove unit floor surface and the conductive layer is improved, and by forming a chromium layer on a copper layer formed in the groove unit or forming a copper oxide layer on the copper layer, one layer may be used as an absorption layer, and consequently, reflexibility is more reduced, and excellent anti-reflection effect and visual property may be secured.

Particularly, in the present invention, the combination of materials forming the conductive pattern (300) of two or more layers is preferably copper and chromium considering the effects of preventing surface oxidation and reducing reflexibility with respect to external light.

Next, a method for preparing a conductive film (10) according to the present invention will be described.

The method for preparing a conductive film (10) according to the present invention includes forming a plurality of groove units (100) including a separation unit (500) on a transparent substrate; forming a conductive layer on the transparent substrate on which a plurality of the groove units (100) are formed; and removing the conductive layer formed on parts other than the groove units.

When the conductive layer formed on parts other than the groove units is removed in the present invention, the conductive layer may also be removed.

For example, the conductive film may include a separation unit in which the conductive layer is formed, or include a separation unit in which the conductive layer is removed, or may not include a separation unit.

Herein, the transparent substrate (20) may be a glass substrate or a transparent polymer film, and herein, the material of the polymer film is not particularly limited as long as the film is transparent, however, for example, a polyethylene terephthalate film, a polycarbonate film, a polyethylenenaphthalene film, a polyimide film, a cellulose film and the like may be used.

Meanwhile, in the present invention, a plurality of the groove units (100) including the separation unit (500) may be formed on the transparent substrate (20) as described above, however, the formation is not limited thereto, and a separate substrate may not be used in the formation.

Next, the step of forming a plurality of groove units (100) including a separation unit (500) may use methods well known in the art, and while not being particularly limited thereto, the step may be carried out using, for example, an imprinting method and the like.

More specifically, the step of forming groove units (100) in the conductive film according to the present invention may be carried out using a method of, for example, preparing a pattern to form, that is, a mold forming a plurality of groove units including a separation unit (500) by engraving on a silicon wafer and the like using a scanner and the like, and then contacting the mold on a transparent substrate and pressurizing the result.

Herein, a plurality of the groove units (100) including the separation unit (500) may be formed with an active energy ray curable resin or a heat curable resin. More specifically, a plurality of the groove units (100) may be formed with urethane acrylate, epoxy acrylate, ester acrylate, polydimethylsiloxane and the like, however, the material is not limited thereto.

Next, the step of forming a conductive layer will be described. Herein, the materials forming the conductive layer mean the materials for forming the conductive pattern (300) described above. Meanwhile, the conductive layer may be formed in a suitable manner considering the raw materials. For example, in the preparation method of the present invention, the conductive layer may be formed by plating, depositing or wet coating a conductive material on a transparent substrate (20) on which a plurality of groove units (100) are formed. More specifically, examples of the method of forming the conductive layer may include an electroless plating method, a chemical vapor deposition method, a physical vapor deposition method or a wet coating method, however, the method is not limited thereto.

Particularly, the conductive layer (300) in the present invention is preferably formed by depositing a metal on a plurality of groove units (100) including a separation unit. Herein, the deposition may be carried out such that, for example, the deposition height of conductive particles is 90% or less of the maximum depth of the groove unit (100), and the incident angle of the deposited conductive particles are within a range of −15° to 15° based on the vertical direction. Preferably, the deposition height may be approximately 1% to 90%, 10% to 70%, or 20% to 40% of the maximum depth of the groove unit (100), and the incident angle of the conductive particles may be approximately −15° to 15°, −10° to 10°, or −5° to 5°.

According to the research results obtained out by the inventors of the present invention, when a conductive layer (300) is formed on a groove unit (100) having a width of 5 μm or less using a conductive pattern formation method generally used in the art, that is, a sputtering or e-beam deposition method, short circuit occurs since the conductive layer (300) in the groove unit (100) is also removed when the conductive layer (300) is removed. However, when the deposition height and the incidental angle of the conductive particles satisfy the range described above in the conductive layer deposition, a conductive pattern having a line width of 5 μm or less may be formed without short circuit, and as a result, a substrate having both excellent conductivity and transparency may be prepared.

Meanwhile, the deposition height of the conductive particles may be adjusted by adjusting the progress rate of a substrate, and the like. When evaporation is caused by identical power, that is, when the amount of evaporation per unit time is constant, deposition time may be adjusted by changing the progress rate of a substrate. More specifically, increasing the progress rate of a substrate may lower the deposition height since the time exposed to vapor may be reduced. In addition, the incident angle of the conductive particles may be adjusted by installing a mask in a deposition apparatus thereby allowing only conductive particles of certain angles to pass through, or adjusting the distance between an evaporation source and a deposited substrate. By installing a mask having an open area with a constant width between an evaporation source and a substrate, only vapors progressing with a target angle pass through. In addition, as the distance between the evaporation source and the deposited substrate is longer, the angle range of the vapors actually reaching the substrate becomes smaller.

Using such a method described above, the conductive layer is formed on the transparent substrate (20) on which a plurality of the groove units (100) are formed, and then the separation unit (500) included in a plurality of the groove units (100) and the conductive layer formed on parts other than the groove units are selectively removed. Herein, the conductive layer may be removed using a physical method. Herein, the physical method means removing a metal layer (300) through physical force and is distinguished from a method of removing a metal layer (300) through a chemical reaction such as etching. More specifically, the step of physically removing the metal layer (300) may be carried out using a scratching method, a detaching method or a combination thereof.

Herein, the scratching method means a method of rubbing off a conductive layer using a melamine foam or a fabric having a rough surface, and the detaching method refers to a method of releasing a conductive layer from a resin layer by applying tension from one end of the conductive layer.

Meanwhile, a conductive layer (300) being removed using a physical method as described above has an advantage in that the process is not only simpler than an existing method of removing a conductive layer (300) using a chemical method used in the art, but is environment-friendly. When a conductive layer (300) is removed using a chemical method, conductive pattern (300) formation areas excluding a separation unit in a groove unit (100) need to be protected through a method of inserting a separate etching-resistant material on the top of the conductive layer (300) formed on parts other than the separation unit in the groove unit (100) in order to selectively remove the conductive layer (300) in regions other than the separation unit (500) and the groove unit (100). In this case, process costs and product yields may be affected since a process of inserting an etching resistant material is added. In comparison, the present invention removing a conductive layer (300) using a physical method does not require an additional process, and does not use toxic chemicals such as an etching liquid and an etching resistant material, therefore, is environment-friendly.

Meanwhile, when a conductive layer is removed using a scratching method and/or a detaching method, fine metal particles produced while removing the conductive layer may be included in the conductive pattern (300) in the groove unit (100), and furthermore, separate fine particles may be included in the conductive pattern (300) in the groove unit (100) in order to obtain effects such as above. When fine particles are included in the conductive pattern (300) in the groove unit (100) as described above, having reflectivity of 90% or less is preferable compared to a case not including fine particles.

The conductive film according to the present invention prepared using methods such as above may be favorably used in touch panels, electrodes for organic solar cells, transparent displays, flexible displays, transparent hot wire films or transparent hot wire windows and the like. Particularly, the conductive film according to the present invention has a conductive pattern formed very finely and thereby has a very excellent visual property since the conductive pattern is not visually recognized. In addition, by including a separation unit between conductive patterns, a film-forming property is superior when selectively removing a conductive layer in order to form the conductive pattern, therefore, productivity is significant improved.

Hereinafter, the present application will be described in detail with reference to examples and comparative examples. However, the examples according to the present application may be modified to various other forms, and the scope of the present application is not interpreted to be limited to the examples described below. The examples of the present application are provided for more completely describing the present application to those skilled in the art.

EXAMPLE 1

A plurality of groove units of which horizontal sections have a lattice form were formed on a polyethylene terephthalate film having a thickness of 100 μm using an imprinting method so that the pattern has a form as in FIG. 5 using an ultraviolet curable resin formed with urethane acrylates. Herein, the depth of the groove unit was 0.5 μm, the width of the conductive pattern was 0.5 μm, and the separation unit had a quadrangle shape in which the width× length was 1.5 μm×1 μm based on the horizontal section, and the cell was formed to have a square form with the length of one side being 198 μm.

Next, copper (Cu) was deposited to a thickness of 200 nm on the polyethylene terephthalate film formed with the groove units including the separation unit having a size described above using a physical vapor deposition method, and a conductive film formed with a copper layer was prepared.

After that, a conductive film was prepared by removing the copper layer formed on the separation unit and the cell using a physical film-forming apparatus including a film-forming bag manufacturing a fabric scratcher having a mesh number of 3000 into a 4 inch-size disc form. Herein, the number of revolution of the disk was 1000 rpm, the progress rate of the conductive film formed with the copper layer was 10 m/min, and the pressure applied to the conductive film formed with the copper layer was 0.02 kgf/cm².

EXAMPLE 2

A plurality of groove units of which horizontal sections have a lattice form were formed on a polyethylene terephthalate film having a thickness of 100 μm using an imprinting method so that the pattern has a form as in FIG. 5 using an ultraviolet curable resin formed with urethane acrylates. Herein, the depth of the groove unit was 0.5 μm, the width of the conductive pattern was 0.5 μm, and the separation unit had a quadrangle shape in which the width× length was 1.5 μm×1 μm based on the horizontal section, and the cell was formed to have a square form with the length of one side being 198 μm.

Next, a copper layer was formed by depositing copper (Cu) to a thickness of 200 nm on the polyethylene terephthalate film formed with the groove units including the separation unit such as above using a physical vapor deposition method, and a chromium layer having a thickness of 20 nm was deposited on the copper layer in the same manner, and a conductive film formed with the copper layer and the chromium layer was prepared.

After that, a conductive film was prepared by removing the copper layer formed on the separation unit and the cell using a physical film-forming apparatus including a film-forming bag manufacturing a fabric scratcher having a mesh number of 3000 into a 4 inch-size disc form. Herein, the number of revolution of the disk was 1000 rpm, the progress rate of the conductive film formed with the copper layer and the chromium layer was 10 m/min, and the pressure applied to the conductive film formed with the copper layer and the chromium layer was 0.02 kgf/cm².

COMPARATIVE EXAMPLE 1

A plurality of groove units of which horizontal sections have a lattice form were formed on a polyethylene terephthalate film having a thickness of 100 μm using an imprinting method so as to have a pattern as in FIG. 1 using an ultraviolet curable resin formed with urethane acrylates.

Herein, the height of the groove unit was 0.5 μm, the width of the conductive pattern was 0.5 μm, and the cell was formed to have a square form with the length of one side of 199.5 μm.

Next, copper (Cu) was deposited to a thickness of 200 nm on the polyethylene terephthalate film formed with the groove units including the separation unit having sizes described above using a physical vapor deposition method, and a conductive film formed with a copper layer was prepared.

After that, a conductive film was prepared by removing the copper layer formed on the separation unit and the cell using a physical film-forming apparatus including a film-forming bag manufacturing a fabric scratcher having a mesh number of 3000 into a 4 inch-size disc form. Herein, the number of revolution of the disk was 1000 rpm, the progress rate of the conductive film formed with the copper layer was 10 m/min, and the pressure applied to the conductive film formed with the copper layer was 0.02 kgf/cm².

TEST EXAMPLE

Test of Film-forming Property

For a test of a film-forming property, the conductive layer was removed in the process of preparing the conductive film according to Example 1 and Comparative Example 1, and the release of the conductive pattern was measured using a 3-dimensional shape measurement microscope VK-200 manufactured by Keyence Corporation of Japan. The results are shown in FIG. 17 and FIG. 18.

Figure 17:
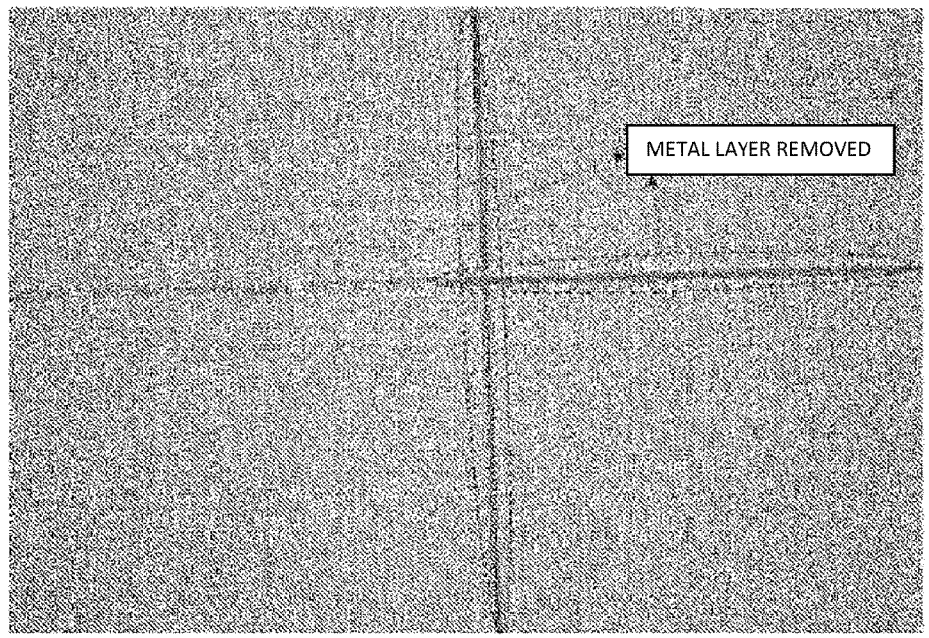
FIG. 17 shows a test result of a film-forming property of a conductive film prepared according to Comparative Example 1.
Figure 18:
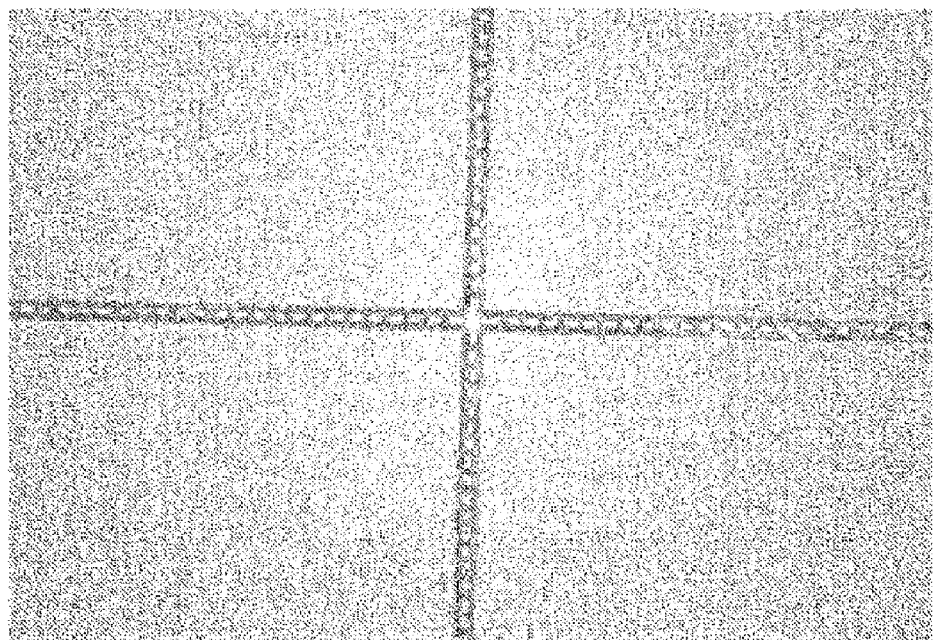
FIG. 18 shows a test result of a film-forming property of a conductive film prepared according to Example 1.

As shown in FIG. 17, in the conductive film according to Comparative Example 1, the conductive pattern in the groove unit was released, however, as shown in FIG. 18, in the conductive film according to Example 1, a normal conductive wire was formed without the release of the conductive pattern.

The examples of the present invention have been described in detail, however, the scope of the present invention is not limited thereto, and it will be apparent to those skilled in the art that various modifications and variations could be made without departing from the spirit and scope of the present invention as defined by the appended claims.

The invention claimed is:

1. A conductive film, comprising:
    a transparent substrate;
    a plurality of groove units of which horizontal sections are formed in a lattice form, the groove units comprising two wall surfaces and a floor surface;
    one or more separation units in the groove units on the floor surface and separated from each wall surface by a space; and
    a plurality of cells that are regions surrounded by the groove units,
    wherein the groove units include an adhesive strength adjusting layer on the groove floor surface and a conductive layer on the adhesive strength adjusting layer forming a conductive pattern of which at least a part is formed through separation by the one or more separation units,
    wherein a maximum width of the groove unit is from 0.1 μm to 20 μm;
    wherein, in the conductive film, a total sum of a horizontal sectional area of the separation unit measured based on a floor surface of the groove unit is 5% to 90% of a total sum of a horizontal sectional area of the groove unit; and wherein a width of the conductive pattern formed through separation by the separation unit is from 0.1 μm to 5 μm.

2. The conductive film of claim 1, comprising a conductive material provided on the separation unit, and insulated with the conductive pattern in the groove unit.

3. The conductive film of claim 1, wherein a maximum depth of the groove unit is from 0.2 μm to 10 μm.

4. The conductive film of claim 1, wherein the lattice form includes a groove unit formed by widthwise extension, a groove unit formed by lengthwise extension and an intersection at which these intersect.

5. The conductive film of claim 1, wherein a border of a horizontal section shape of the separation unit includes a straight line, a curve, a wave line, a zigzag line or a combination thereof.

6. The conductive film of claim 5, wherein the horizontal section shape of the separation unit includes a quadrangle, a triangle, a circle, an ellipse, a polygon, a figure formed by connecting two or more arcs with different radii of curvature, a figure formed by connecting at least one arc and at least one straight line, or a form mixing these.

7. The conductive film of claim 1, wherein a vertical section shape of the separation unit is a plane shape, a convex shape or a concave shape.

8. The conductive film of claim 1, wherein a border of a vertical section shape of the separation unit includes a straight line, a curve, a wave line, a zigzag line or a combination thereof.

9. The conductive film of claim 7, wherein the vertical section shape of the separation unit is a convex shape, and a height difference between a highest point of the separation unit and a floor surface of the groove unit is from 0.5 times to 1 time of a depth of the groove unit.

10. The conductive film of claim 1, wherein the separation unit and the cell satisfy the relationship of the following [Equation 1]:

$$\frac{1}{10^6} \leq \frac{\text{Horizontal Sectional Area of One Separation Unit}}{\text{Horizontal Sectional Area of One Cell}} \leq \frac{1}{5} \quad \text{[Equation 1]}$$

wherein, the horizontal sectional area means a value measured based on an uppermost surface of the conductive film.

11. The conductive film of claim 1, wherein a width of a conductive pattern part formed by connecting a conductive pattern that is not formed through separation by the separation unit is from 0.2 μm to 10 μm.

12. The conductive film of claim 4, wherein the conductive pattern formed at the intersection has a cross shape connecting 4 corners of the intersection, and a width of the cross-shaped conductive pattern is from 0.1 μm to 10 μm.

13. The conductive film of claim 1, wherein a thickness of the conductive pattern is from 0.01 μm to 3 μm.

14. The conductive film of claim 1, wherein the conductive pattern is formed in two or more layers.

15. The conductive film of claim 14, wherein the conductive pattern formed in two or more layers is formed using different materials.

* * * * *